United States Patent [19]

Sato et al.

[11] Patent Number: 4,497,922
[45] Date of Patent: Feb. 5, 1985

[54] COMPOSITIONS OF MATERIALS FOR FORMING PROTECTIVE FILM IN SEMICONDUCTOR DEVICE

[75] Inventors: Hidetaka Sato; Shunichiro Uchimura; Isao Uchigasaki, all of Hitachi; Daisuke Makino, Mito, all of Japan

[73] Assignee: Hitachi Chemical Company, Ltd., Tokyo, Japan

[21] Appl. No.: 501,151

[22] Filed: Jun. 6, 1983

[30] Foreign Application Priority Data

Jun. 11, 1982 [JP] Japan ............... 57-101027

[51] Int. Cl.$^3$ ............... C08K 5/34
[52] U.S. Cl. ............... 524/104; 524/173; 524/167; 524/233; 528/26; 528/38; 174/110 S; 174/110 SR; 174/110 N
[58] Field of Search ............ 528/26, 38; 174/110 SR, 174/110 S, 110 N; 524/104, 233, 173, 167

[56] References Cited

U.S. PATENT DOCUMENTS 4,338,426  7/1982  Sato et al. ............... 528/26
4,395,527  7/1983  Berger ............... 528/26

*Primary Examiner*—Melvyn I. Marquis
*Attorney, Agent, or Firm*—Antonelli, Terry & Wands

[57] ABSTRACT

A composition of materials comprising a polyamide acid-silicone intermediate obtained by reacting (a) a diaminoamide compound of the formula:

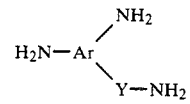

wherein Ar and Y are as defined in the specification, (b) a diaminosiloxane, (c) a diamine, and (d) an aromatic tetracarboxylic acid dianhydride can form a protective film used in a semiconductor device excellent in adhesive properties, heat resistance and preventing soft errors due to α-rays.

15 Claims, No Drawings

COMPOSITIONS OF MATERIALS FOR FORMING PROTECTIVE FILM IN SEMICONDUCTOR DEVICE

This invention relates to a composition of materials for forming a protective film in a semiconductor device, more particularly to a composition of materials for forming a protective film in a semiconductor device not causing errorous operations (soft errors) by incidence of α-rays from outside of a semiconductor element.

Recently it has become known that when incidence of α-rays into semiconductor memory elements takes place, reversal of information of "1"→"0" or "0"→"1", that is, soft errors, is often caused. A major source of the α-rays is trace amounts of uranium and thorium contained in a ceramic case or an inorganic filler contained in a thermosetting resin used for packaging the elements. Thus, various methods for reducing the uranium and thorium contents have been proposed, but since there are many technically difficult problems, this problem is not solved completely.

On the other hand, soft errors can be prevented by considering circuit design of semiconductor elements. But this method brings about defects of increasing the chip area, and the like, so that it is not used practically except for a very special case.

It is known that organic materials generally have lower contents of uranium, thorium, etc., which are α-rays sources other than inorganic materials, and even if uranium, thorium, etc. are contained in the organic materials, their contents can relatively easily be reduced by purification operations of constituting raw materials such as distillation, recrystallization, reprecipitation of the materials, and the like and that the organic materials have a function of absorbing α-rays. Thus, there have been done many trials of forming an organic layer between a packaging layer and a semiconductor element to absorb α-rays by the organic layer and to prevent soft errors of the element, and some of them gain practical use.

Semiconductor memory elements are packaged by ceramics, thermosetting resins, etc., for securing moisture resistance. In the case of ceramic packaging, the packaging temperature is about 350° C. in the case of using gold-tin eutectic crystal as packaging adhesive, but the packaging temperature is about 450° C. in the case of using low-melting glass as packaging adhesive. In the case of thermosetting resin packaging, curing is conducted by heating at about 200° C. Therefore, the organic material used for absorbing α-rays should have properties for sufficiently withstanding such heat-treating temperatures. As the organic material for such a purpose, polyimide series resins are mainly used.

On the other hand, as passivation film, there are used films of silicon oxide, silicon nitride, and the like in semiconductor memory elements. Generally speaking, polyimide series resins have very poor adhesive properties to these passivation films. In order to give good adhesive properties, it is necessary to use a coupling agent such as silanes, organic chelates of metals, etc. As mentioned above, so far as conventional polyimide series resins are used, the step of forming a coupling agent layer is inevitable, which results in not only making the process complicated but also causing a danger of forming a new source for α-rays when organic chelate compounds of metals are used as coupling agent because the removal of materials emitting α-rays contained in inorganic materials is very difficult as mentioned above. Further since the decomposition temperature of silane coupling agents is 300° to 350° C., the silane coupling agents cannot withstand the ceramic packaging temperature, particularly in the case of using low-melting glass.

This invention provides a composition of materials for forming a protective film in a semiconductor device, a cured product of said composition being excellent in adhesive properties, heat resistance withstanding the heat-treatment temperature at the time of packaging and preventing soft errors due to α-rays.

In accordance with this invention, there is provided a composition of materials for forming a protective film in a semiconductor device which comprises (i) a polyamide acid-silicone intermediate obtained by reacting:
(a) a diaminoamide compound of the formula:

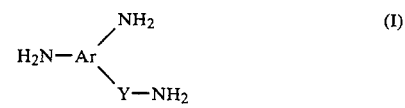

wherein Ar is an aromatic residue such as

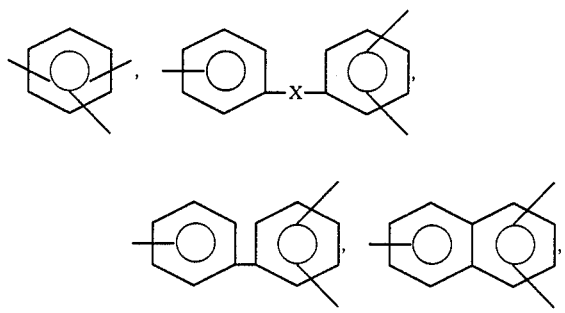

etc.; X is O, CH$_2$, SO$_2$, S or CO; Y is SO$_2$ or CO, and one of amino groups and the Y—NH$_2$ group are positioned at ortho position each other,
(b) a diaminosiloxane,
(c) a diamine, and
(d) an aromatic tetracarboxylic acid dianhydride, and
(ii) a solvent.

The polyamide acid-silicone intermediate used in this invention can be produced by a known process, for example, a process disclosed in U.S. Pat. No. 4,338,426.

The component (a), diaminoamide compounds of the formula (I), includes the following compounds:

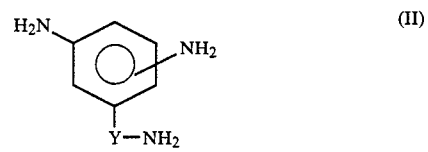

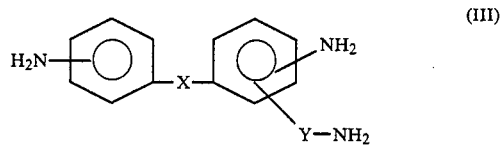

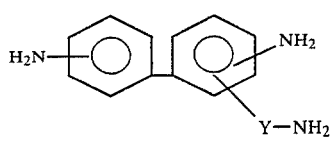

(IV)

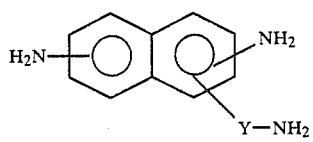

(V)

In the above formulae (II) to (V), Y is $SO_2$ or CO, X is O, $CH_2$, $SO_2$, S or CO, and the Y—$NH_2$ group is positioned at the ortho position as to one $NH_2$ group. Examples of the diaminoamide compounds (I) are
4,4'-diaminodiphenyl ether-3-sulfonamide,
3,4'-diaminodiphenyl ether-4-sulfonamide,
3,4'-diaminodiphenyl ether-3'-sulfonamide,
3,3'-diaminodiphenyl ether-4-sulfonamide,
4,4'-diaminodiphenylmethane-3-sulfonamide,
3,4'-diaminodiphenylmethane-4-sulfonamide,
3,4'-diaminodiphenylmethane-3'-sulfonamide,
3,3'-diaminodiphenylmethane-4-sulfonamide,
4,4'-diaminodiphenylsulfone-3-sulfonamide,
3,4'-diaminodiphenylsulfone-4-sulfonamide,
3,4'-diaminodiphenylsulfone-3'-sulfonamide,
3,3'-diaminodiphenylsulfone-4-sulfonamide,
4,4'-diaminodiphenylsulfide-3-sulfonamide,
3,4'-diaminodiphenylsulfide-4-sulfonamide,
3,3'-diaminodiphenylsulfide-4-sulfonamide,
3,4'-diaminodiphenylsulfide-3'-sulfonamide,
1,4-diaminobenzene-2-sulfonamide,
4,4'-diaminodiphenyl ether-3-carbonamide,
3,4'-diaminodiphenyl ether-4-carbonamide,
3,4'-diaminodiphenyl ether-3'-carbonamide,
3,3'-diaminodiphenyl ether-4-carbonamide,
4,4'-diaminodiphenylmethane-3-carbonamide,
3,4'-diaminodiphenylmethane-4-carbonamide,
3,4'-diaminodiphenylmethane-3'-carbonamide,
3,3'-diaminodiphenylmethane-4-carbonamide,
4,4'-diaminodiphenylsulfone-3-carbonamide,
3,4'-diaminodiphenylsulfone-4-carbonamide,
3,4'-diaminodiphenylsulfone-3'-carbonamide,
3,3'-diaminodiphenylsulfone-4-carbonamide,
4,4'-diaminodiphenylsulfide-3-carbonamide,
3,4'-diaminodiphenylsulfide-4-carbonamide,
3,3'-diaminodiphenylsulfide-4-carbonamide,
3,4'-diaminodiphenylsulfide-3'-sulfonamide,
1,4-diaminobenzene-2-carbonamide,
and the like. These diaminoamide compounds can be used alone or as a mixture thereof.

The diaminosiloxane (b) usable in this invention can be represented by the formula:

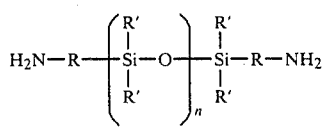

wherein R is a bivalent hydrocarbon group such as alkylene preferably having 1 to 5 carbon atoms; phenylene, phenylene substituted by alkyl, and R' is a monovalent hydrocarbon group such as alkyl preferably having 1 to 5 carbon atoms, phenyl, phenyl substituted by alkyl, each R or R' may be the same or different, and n is an integer of 1 or more.

Examples of these diaminosiloxanes are as follows:

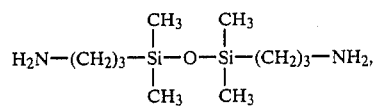

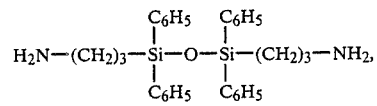

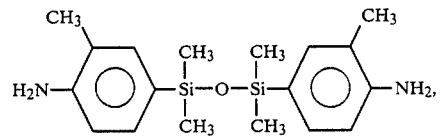

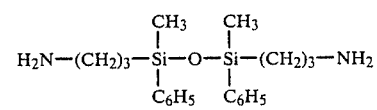

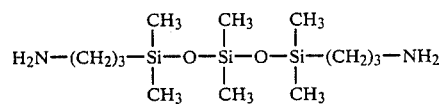

These diaminosiloxanes can be used alone or as a mixture thereof.

These diaminodisiloxanes can be synthesized by the process described in, for example, U.S. Pat. No. 3,185,719.

As the diamine (c), there can be used conventionally used ones, for example, 4,4'-diaminodiphenyl ether, 4,4'-diaminodiphenylmethane, 4,4'-diaminodiphenylsulfone, 4,4'-diaminodiphenylsulfide, benzidine; m-phenylenediamine, p-phenylenediamine, 1,5-naphthalenediamine, 2,6-naphthalenediamine, and the like.

These diamines can be used alone or as a mixture thereof.

As the tetracarboxylic acid dianhydride (d), there can be used conventionally used ones, for example, pyromellitic acid dianhydride, 3,3',4,4'-diphenyltetracarboxylic acid dianhydride, 3,3',4,4'-benzophenonetetracarboxylic acid dianhydride, cyclopentanetetracarboxylic acid dianhydride, 1,2,5,6-naphthalenetetracarboxylic acid dianhydride, 2,3,6,7-naphthalenetetracarboxylic acid dianhydride, 2,3,5,6-pyridinetetracarboxylic acid dianhydride, 1,4,5,8-naphthalenetetracarboxylic acid dianhydride, 3,4,9,10-perylenetetracarboxylic acid dianhydride, 4,4'-sulfonyldiphthalic acid dianhydride, and the like. Among them, 3,3',4,4'-diphenyltetracarboxylic acid dianhydride is more preferable from the viewpoint of heat resistance of a cured product of the polyamide acid-silicone intermediate. These tetracarboxylic acid dianhydrides can be used alone or as a mixture thereof.

In this invention, about equimolar amount of tetracarboxylic acid dianhydride is used per mole of the total of the diaminoamide compound, the diaminosiloxane and the diamine (or a total of the diamine components (a), (b) and (c)).

It is preferable to use 5 to 30% by mole of the diaminoamide compound (a) and 0.1 to 50% by mole of the diaminosiloxane (b) based on the total amounts of the diamine component, i.e., the diaminoamide (a), the diaminosiloxane (b) and the diamine (c).

In this invention, an inert solvent can be used. The solvent is not always required to dissolve the above-mentioned four kinds of monomers (a) to (d), but preferable solvents are those which can dissolve the produced polyamide acid-silicone intermediate.

Examples of inert solvents are N-methyl-2-pyrrolidone, N,N-dimethylacetamide, N,N-dimethylformamide, N,N-diethylformamide, dimethyl sulfoxide, hexamethylphosphoramide, tetramethylene sulfone, and the like. These solvents can be used alone or as a mixture thereof.

These inert solvents can be used in the reaction of the components (a) to (d) or can be used as the component (ii) in the composition of this invention.

In a preferred process of this invention, a diaminoamide compound (a), a diaminosiloxane (b), a diamine (c) and a tetracarboxylic acid dianhydride (d) are dissolved in the above-mentioned inert solvent as sufficiently as possible and stirred while maintaining the reaction system preferably at about 80° C. or lower, more preferably near room temperature or lower. Under such conditions, the reaction proceeds rapidly with increasing the viscosity of the reaction system gradually to produce the polyamide acid-silicone intermediate.

The polyamide acid-silicone intermediate used in this invention has, for example, the following recurring structural units of the formulae (VI) to (VIII):

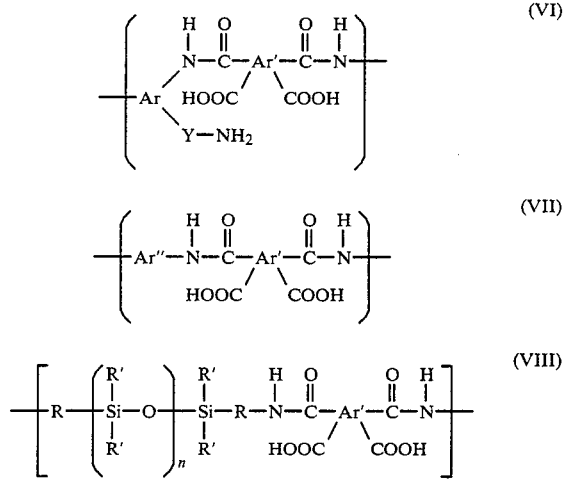

In the above-mentioned formulae, Ar, Ar' and Ar" are independently aromatic residues derived from the raw materials mentioned above. R is a divalent hydrocarbon group such as alkylene preferably having 1 to 5 carbon atoms; phenylene, phenylene substituted by $C_{1-5}$ alkyl; R' is a monovalent hydrocarbon group such as alkyl preferably having 1 to 5 carbon atoms, phenyl, phenyl substituted by $C_{1-5}$ alkyl; and Y is $SO_2$ or CO.

The composition of materials for forming a protective film in a semiconductor memory device of this invention can be coated on a surface of a semiconductor element by a conventional process such as a dispenser process, or the like, heat-treated for removing a solvent dissolving the polyamide acid-silicone intermediate, followed by dehydration and ring closure to give a protective film layer of polyimide-isoindoloquinazolinedione-silicone copolymer. For example, the structural unit of the formula (VI) contained in the polyamide acid-silicone intermediate is changed to the following structural unit with heating:

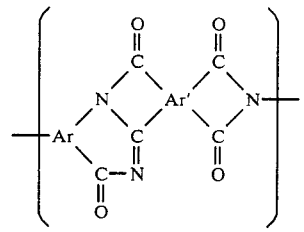

The composition of materials for forming a protective film in a semiconductor device preferably contains uranium and thorium as a total amount 1 ppb or less, more preferably 0.2 ppb or less. This is because when the total amounts of uranium and thorium are 1 ppb or less, more preferably 0.2 ppb or less, the influence of α-rays causing soft errors radiated from the protective film is reduced remarkably. When the total amounts of uranium and thorium in the composition of this invention is more than 1 ppb, more preferably more than 0.2 ppb, the total amounts of uranium and thorium can be reduced by purification of the above-mentioned monomers (a) to (d), or the solvent used.

The purification of the monomers (a) to (d) can be conducted by a so-called recrystallization process wherein a monomer is dissolved in a suitable solvent with heating, the resulting solution is filtered, and the filtrate is cooled to precipitate the monomer. There is no particular limit to the conditions employed. The purification of the solvent can be conducted by distillation.

The composition of this invention may contain a coupling agent such as silane compounds, e.g. aminosilane, epoxysilane, etc.

The composition of this invention is coated on a semiconductor element in the form of a varnish, dehydrated and ring-closed to form a protective film of polyimide-isoindoloquinazolinedione-silicone copolymer. The thickness of the protective film is preferably 30 μm or more, more preferably 40 μm or more in order to show a preferable effect for shielding α-rays.

The packaging layer in a semiconductor device having the protective film obtained by using the composition of this invention is constituted by a ceramic package, a metal package such as a metallic can, etc., a resin package such as an epoxy resin mold, etc.

Particularly preferable effects can be obtained when a semiconductor device is constituted by using the composition of this invention for forming a protective film, a ceramic package as packaging layer and low-melting glass as packaging adhesive.

Further, the composition of this invention shows more effective function when used in semiconductor memory elements having a higher level of integration in memory circuits. More concretely, the composition of this invention is more effective when used in semiconductor memory elements having a degree of integration (a memory capacity) of 1 K-bit or more in the case of a bipolar type and a degree of integration of 16 K-bits or more in the case of a MOS type.

This invention is illustrated by way of the following Examples, in which all percents are by weight unless otherwise specified.

EXAMPLE 1

Using a three-necked flask equipped with a thermometer, a stirrer and a calcium chloride tube, 2.43 g of 4,4'-diaminodiphenyl ether-3-carbonamide obtained by recrystallization using n-butanol as solvent, 9.51 g of para-phenylenediamine obtained by recrystallization using ethyl alcohol as solvent, 0.50 g of 1,3-bis(aminopropyl)tetramethyldisiloxane purified by distillation under reduced pressure, and 29.42 g of 3,3',4,4'-biphenyltetracarboxylic acid dianhydride purified by using acetic anhydride were reacted at room temperature in 240 g of N-methyl-2-pyrrolidone purified by distillation under reduced pressure. As a result, there was obtained a polyamide acid-silicone intermediate solution having a resin content of 14.5% and a viscosity of 125 poises. After removing the solvent from said solution, the uranium and thorium contents were measured by radiation analysis. The uranium content was less than 0.02 ppb and the thorium content was less than 0.05 ppb, these values of 0.02 ppb and 0.05 ppb being detecting limits, respectively.

Then, the solution was coated on a surface of MOS type RAM having a degree of integration of 16 K-bits and heat-treated at 100° C. for 2 hours, 200° C. for 1 hour and 350° C. for 1 hour to form a protective film layer of polyimide-isoindoloquinazolinedione-silicone copolymer having a thickness of about 40 μm. Subsequently, the resulting semiconductor element was packaged by using a ceramic package containing low-melting glass as packaging adheisve at about 450° C.

The soft error rate of the resulting semiconductor device was 30 fits (1 fit means a unit showing that an error takes place per $10^9$ hours per one element).

On the other hand, a naked semiconductor memory element not packaged by a ceramic package was allowed to stand in water vapor heated at 120° C. under a pressure of 2.2 atmospheres for 20 hours. Then the thus treated element was subjected to a peeling-off test using an adhesive Cellophane type but no peeling of the protective film layer from the semiconductor memory element was observed. This showed that high adhesive properties were maintained after such severe heating in water vapor.

COMPARATIVE EXAMPLE 1

4,4'-Diaminodiphenyl ether in an amount of 10.0 g and 10.9 g of pyromellitic dianhydride, both being purified by the same method as described in Example 1, were reacted at room temperature in 118.4 g of N-methyl-2-pyrrolidone purified by distillation to give a polyamide acid solution having a resin content of 14.7% and a viscosity of 135 poises.

On the same semiconductor memory element as used in Example 1, a coupling agent layer having a thickness of about 200 Å was formed by coating a toluene solution containing 1% of ethylacetoacetate aluminum diisopropylate and heating at 350° C. for 1 hour. Then, the above-mentioned polyamide acid solution was coated on the coupling agent layer, heat-treated under the same conditions as used in Example 1 to form a protective film layer of polyimide having a thickness of 45 μm.

Packaging was conducted in the same manner as described in Example 1.

The soft error rate of the resulting ceramic packaged semiconductor device was 250 fits. The uranium content in the coupling agent layer was 0.3 ppb and that of the polyimide film was less than 0.02 ppb.

On the other hand, when a polyimide film was formed on a semiconductor memory element without forming a coupling agent layer in the manner similar to that described above and allowed to stand in water vapor heated at 120° C. under a pressure of 2.2 atmospheres for 1 hour, the polyimide film was peeled off from the semiconductor memory element by the peeling-off test mentioned above.

What is claimed is:

1. A composition of materials for forming a protective film in a semiconductor device, said film preventing soft errors due to α-rays, which comprises:
   (i) a polyamide acid-silicone intermediate obtained by reacting
      (a) a purified diaminoamide compound of the formula:

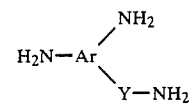

wherein Ar is an aromatic residue; Y is $SO_2$ or CO, and one of amino groups and the Y—$NH_2$ group are positioned at ortho position each other,
      (b) a purified diaminosiloxane,
      (c) a purified diamine, and
      (d) a purified aromatic tetracarboxylic acid dianhydride, and
   (ii) a purified inert solvent.

2. A composition according to claim 1, wherein the composition has a total amount of uranium and thorium 1 ppb or less.

3. A composition according to claim 1, wherein the composition has a total amount of uranium and thorium 0.2 ppb or less.

4. A semiconductor device having a protective film obtained from the composition of claim 1 formed thereon, said semiconductor device comprising a bipolar type semiconductor memory element having a degree of integration of 1 K-bit or more.

5. A semiconductor device having a protective film obtained from the composition of claim 1 formed thereon, said semiconductor device comprising a MOS type semiconductor memory element having a degree of integration of 16 K-bits or more.

6. A semiconductor device having a protective film obtained from the composition of claim 1 formed thereon, said semiconductor device having a package layer of ceramic and using low-melting glass as packaging adhesive.

7. A composition according to claim 1, wherein the diaminosiloxane is represented by the formula:

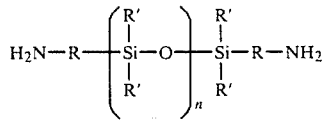

wherein R is a divalent hydrocarbon group; R' is a monovalent hydrocarbon group; each R or R' may be the same or different; and n is an integer of 1 or more.

8. A composition according to claim 1, wherein the diaminoamide compound is 4,4'-diaminodiphenyl ether-3-carbonamide.

9. A composition according to claim 1, wherein the diamine is 4,4'-diaminodiphenyl ether, 4,4'-diaminodiphenylmethane, or a mixture thereof.

10. A composition according to claim 1, wherein the aromatic tetracarboxylic acid dianhydride is 3,3',4,4'-diphenyltetracarboxylic acid dianhydride, 4,4'-benzophenonetetracarboxylic acid dianhydride, pyromellitic acid dianhydride, or a mixture thereof.

11. A composition according to claim 7, wherein the diaminosiloxane is 1,3-bis-(aminopropyl)-tetramethyldisiloxane.

12. A semiconductor device having a protective film of polyimide-isoindoloquinazolinedione-silicone copolymer obtained from the composition of claim 1.

13. A composition according to claim 1, wherein the diaminoamide compound is 4,4'-diaminodiphenyl ether-3-carbonamide; the diamine is 4,4'-diaminodiphenyl ether, 4,4'-diaminodiphenyl methane, or a mixture thereof; the aromatic tetracarboxylic acid dianhydride is 3,3',4,4'-diphenyltetracarboxylic acid dianhydride, 4,4'-benzophenonetetracarboxylic acid dianhydride, pyromellitic acid dianhydride, or a mixture thereof; and the diaminosiloxane is 1,3-bis-(aminopropyl)tetramethyldisiloxane.

14. A composition according to claim 1, wherein the inert solvent comprises N-methyl-2-pyrrolidone, N,N-dimethylacetamide, N,N-dimethylformamide, N,N-diethylformamide, dimethyl sulfoxide, hexamethylphosphoramide, tetramethylene sulfone, or a mixture thereof.

15. A semiconductor device according to claim 12, wherein the composition of claim 1 has a total amount of uranium and thorium of 1 ppb or less.

* * * * *